(12) United States Patent
Park et al.

(10) Patent No.: US 10,446,471 B2
(45) Date of Patent: Oct. 15, 2019

(54) SEMICONDUCTOR PACKAGES THAT INCLUDE A HEAT PIPE FOR EXHAUSTING HEAT FROM ONE OR MORE ENDS OF THE PACKAGE

(71) Applicant: Samsung Electronics Co., Ltd., Suwon-si, Gyeonggi-do (KR)

(72) Inventors: JaeHong Park, Gumi-si (KR); Hanhong Lee, Suwon-si (KR); Sungwoo Joo, Suwon-si (KR); Woon-young Baek, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/204,543

(22) Filed: Nov. 29, 2018

(65) Prior Publication Data

US 2019/0096786 A1    Mar. 28, 2019

Related U.S. Application Data

(63) Continuation of application No. 15/647,871, filed on Jul. 12, 2017, now Pat. No. 10,177,072.

(30) Foreign Application Priority Data

Oct. 5, 2016 (KR) .................. 10-2016-0128451

(51) Int. Cl.
*H01L 23/427* (2006.01)
*H01L 23/053* (2006.01)
(Continued)

(52) U.S. Cl.
CPC ............ *H01L 23/427* (2013.01); *H01L 23/04* (2013.01); *H01L 23/053* (2013.01); *H01L 23/433* (2013.01); *H01L 23/4334* (2013.01); *H01L 23/544* (2013.01); *H01L 25/0655* (2013.01); *H01L 24/13* (2013.01); *H01L 24/16* (2013.01); *H01L 24/17* (2013.01); *H01L 24/32* (2013.01);
(Continued)

(58) Field of Classification Search
CPC ......... H01L 23/427; H01L 2924/16151; H01L 2924/16152; H01L 2924/16153; H01L 2924/1616; H01L 2924/162; H01L 2924/16235; H01L 2924/16251
See application file for complete search history.

(56) References Cited

U.S. PATENT DOCUMENTS

| 4,730,665 A | 3/1988 | Cutchaw |
| 5,323,292 A | 6/1994 | Brzezinski |

(Continued)

FOREIGN PATENT DOCUMENTS

| KR | 100965269 | 6/2010 |
| KR | 100984857 | 10/2010 |
| KR | 101017839 | 3/2011 |

*Primary Examiner* — Scott B Geyer
(74) *Attorney, Agent, or Firm* — Myers Bigel, P.A.

(57) ABSTRACT

A semiconductor package includes a package substrate including a fastening section at one end and a connecting terminal section at an opposite end, at least one semiconductor device mounted on the package substrate, at least one heat pipe on the at least one semiconductor device, and a lid on the at least one semiconductor device and the at least one heat pipe. At least one end of the heat pipe is between the at least one semiconductor device and either the fastening section or the connecting terminal section.

17 Claims, 15 Drawing Sheets

(51) Int. Cl.
  *H01L 23/433*   (2006.01)
  *H01L 23/544*   (2006.01)
  *H01L 25/065*   (2006.01)
  *H01L 23/04*    (2006.01)
  *H01L 23/40*        (2006.01)
  *H01L 23/00*        (2006.01)

(52) U.S. Cl.
  CPC .......... *H01L 24/73* (2013.01); *H01L 25/0657* (2013.01); *H01L 2023/4068* (2013.01); *H01L 2223/54433* (2013.01); *H01L 2223/54486* (2013.01); *H01L 2224/131* (2013.01); *H01L 2224/13025* (2013.01); *H01L 2224/16145* (2013.01); *H01L 2224/16227* (2013.01); *H01L 2224/17181* (2013.01); *H01L 2224/32145* (2013.01); *H01L 2224/32225* (2013.01); *H01L 2224/32245* (2013.01); *H01L 2224/73204* (2013.01); *H01L 2224/73253* (2013.01); *H01L 2225/06513* (2013.01); *H01L 2225/06517* (2013.01); *H01L 2225/06541* (2013.01); *H01L 2225/06565* (2013.01); *H01L 2225/06589* (2013.01); *H01L 2924/1434* (2013.01); *H01L 2924/15162* (2013.01); *H01L 2924/15311* (2013.01); *H01L 2924/166* (2013.01); *H01L 2924/16251* (2013.01); *H01L 2924/18161* (2013.01)

(56) References Cited

U.S. PATENT DOCUMENTS

| | | | |
|---|---|---|---|
| 5,331,510 A | 7/1994 | Ouchi | |
| 5,355,942 A | 10/1994 | Conte | |
| 5,549,155 A | 8/1996 | Meyer | |
| 5,880,524 A | 3/1999 | Xie | |
| 6,111,750 A | 8/2000 | Gates | |
| 6,133,631 A | 10/2000 | Belady | |
| 6,212,074 B1 | 4/2001 | Gonsalves | |
| 6,263,959 B1 | 7/2001 | Ikeda | |
| 6,525,420 B2 | 2/2003 | Zuo | |
| 6,661,660 B2 | 12/2003 | Prasher | |
| 6,665,187 B1 | 12/2003 | Alcoe | |
| 6,666,260 B2 | 12/2003 | Tantoush | |
| 6,992,888 B1* | 1/2006 | Iyer | H01L 23/3732 165/80.4 |
| 7,115,987 B2 | 10/2006 | Holalkere | |
| 7,477,517 B2 | 1/2009 | Khanna | |
| 7,480,992 B2 | 1/2009 | Okamoto | |
| 7,621,316 B2 | 11/2009 | Kawabata | |
| 7,759,170 B2 | 7/2010 | Pu | |
| 7,796,395 B2 | 9/2010 | Kim | |
| 8,044,506 B2 | 10/2011 | Yun | |
| 8,184,439 B2 | 5/2012 | Baek | |
| 8,471,380 B2 | 6/2013 | Brandenburg | |
| 8,908,373 B2 | 12/2014 | Sakamoto | |
| 9,123,686 B2 | 9/2015 | Mataya | |
| 9,338,927 B2 | 5/2016 | Mataya | |
| 9,698,132 B1 | 7/2017 | Ady | |
| 9,930,807 B2 | 3/2018 | Chainer | |
| 2002/0056908 A1 | 5/2002 | Brownell | |
| 2002/0100968 A1* | 8/2002 | Zuo | H01L 23/427 257/715 |
| 2004/0196634 A1 | 10/2004 | Mallik | |
| 2005/0201060 A1 | 9/2005 | Huang | |
| 2006/0033236 A1 | 2/2006 | Brandenburg | |
| 2006/0044763 A1 | 3/2006 | Hornung | |
| 2006/0060952 A1 | 3/2006 | Yuan | |
| 2006/0261469 A1 | 11/2006 | Ni | |
| 2007/0108599 A1 | 5/2007 | Im | |
| 2007/0267179 A1 | 11/2007 | Hou | |
| 2008/0186685 A1 | 8/2008 | Cho | |
| 2009/0034327 A1 | 2/2009 | Yun | |
| 2011/0100604 A1 | 5/2011 | Anzai | |
| 2014/0015106 A1 | 1/2014 | Hsieh | |
| 2014/0239487 A1 | 8/2014 | Hata | |
| 2015/0179617 A1 | 6/2015 | Lin | |
| 2015/0206822 A1 | 7/2015 | Oda | |
| 2015/0327397 A1 | 11/2015 | Murayama | |
| 2017/0077010 A1 | 3/2017 | Yan | |

* cited by examiner

SEMICONDUCTOR PACKAGES THAT INCLUDE A HEAT PIPE FOR EXHAUSTING HEAT FROM ONE OR MORE ENDS OF THE PACKAGE

CROSS-REFERENCE TO RELATED APPLICATIONS

This U.S. non-provisional patent application is a continuation of U.S. application Ser. No. 15/647,871, filed Jul. 12, 2017, which claims priority under 35 U.S.C § 119 of Korean Patent Application 10-2016-0128451 filed on Oct. 5, 2016 the entire contents of which are hereby incorporated by reference.

FIELD

The present inventive concept relates to a semiconductor package, and, more particularly, to a semiconductor package in which a semiconductor device is mounted.

BACKGROUND

In the semiconductor industry, high capacity, thinness, and small size of semiconductor devices and electronic products using the same are in demand and various package techniques have been used to address this demand. One approach is a packaging technique that vertically stacks a plurality of semiconductor chips to achieve a high density chip stacking. This packaging technique has an advantage capable of integrating semiconductor chips having various functions on a small area as compared to a conventional package consisting of one semiconductor chip.

SUMMARY

Embodiments of the present inventive concept provide a semiconductor package having improved heat dissipation characteristics.

According to exemplary embodiments of the present inventive concept, a semiconductor package may comprise: a package substrate comprising a fastening section and a connecting terminal section at opposite ends thereof, respectively; at least one semiconductor device mounted on the package substrate; at least one heat pipe on the at least one semiconductor device; and a lid on the at least one semiconductor device and the at least one heat pipe. At least one end of the at least one heat pipe may be between the at least one semiconductor device and either the fastening section or the connecting terminal section.

According to exemplary embodiments of the present inventive concept, a semiconductor package may comprise: a package substrate; at least one semiconductor device mounted on the package substrate; at least one heat pipe on the at least one semiconductor device; and a lid on the at least one semiconductor device and the at least one heat pipe. The at least one heat pipe may comprise: a first extension that runs across the at least one semiconductor device and extends in a first direction; and a second extension that extends from the first extension in a second direction crossing the first direction. The second extension may be positioned between one end of the package substrate and one end of the semiconductor device in plan view.

According to exemplary embodiments of the present inventive concept, a semiconductor package may comprise: a package substrate having first and second external interface sections at opposing ends, respectively; a semiconductor device mounted on the package substrate; a heat pipe on the semiconductor device; and a lid on the heat pipe and the semiconductor device. The heat pipe is configured to exhaust thermal energy through one of the first and second external interfaces at a first rate and the lid is configured to exhaust thermal energy to air at a second rate, the first rate being greater than the second rate.

It is noted that aspects of the inventive concepts described with respect to one embodiment, may be incorporated in a different embodiment although not specifically described relative thereto. That is, all embodiments and/or features of any embodiment can be combined in any way and/or combination. These and other aspects of the inventive concepts are described in detail in the specification set forth below.

DETAILED DESCRIPTION OF EMBODIMENTS

Figure 1:
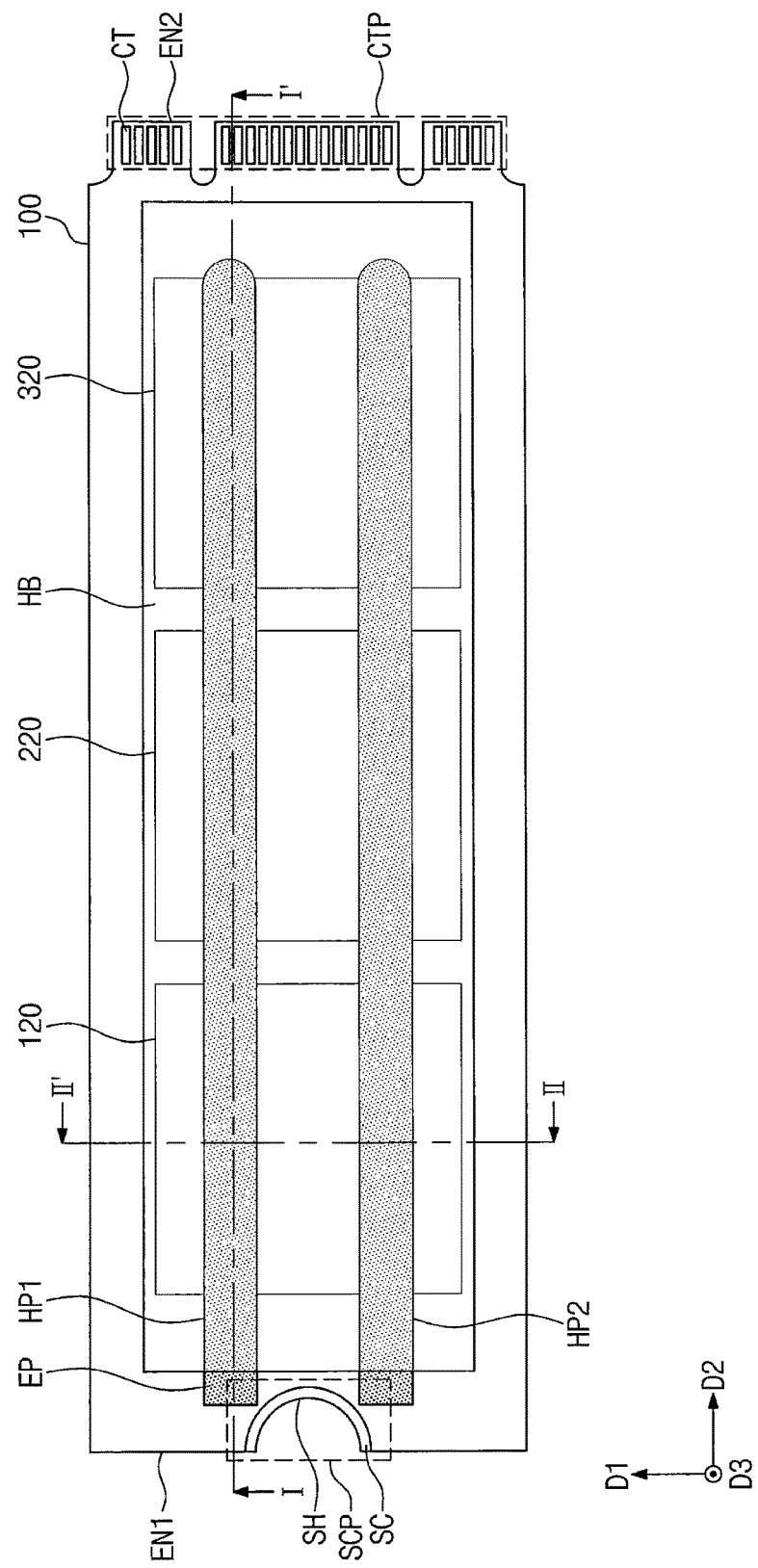
FIG. 1 is a plan view illustrating a semiconductor package according to exemplary embodiments of the present inventive concept.
Figure 2:
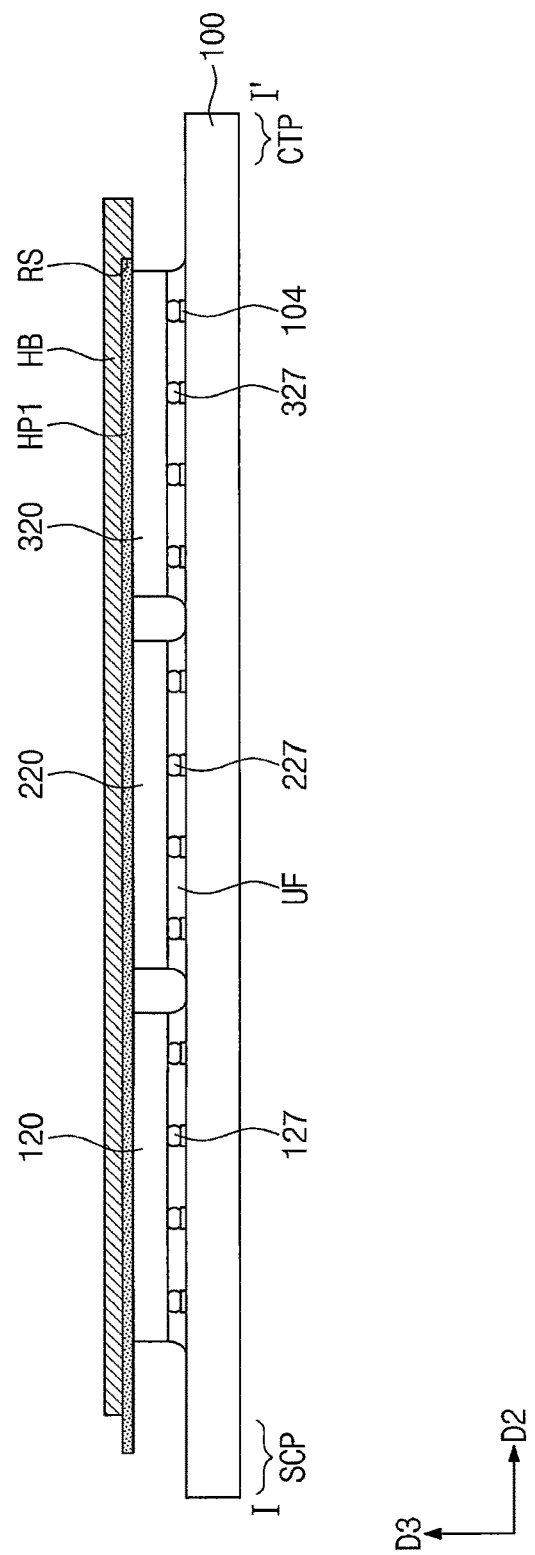
FIG. 2 is a cross-sectional view taken along line I-I' of FIG. 1.
Figure 3:
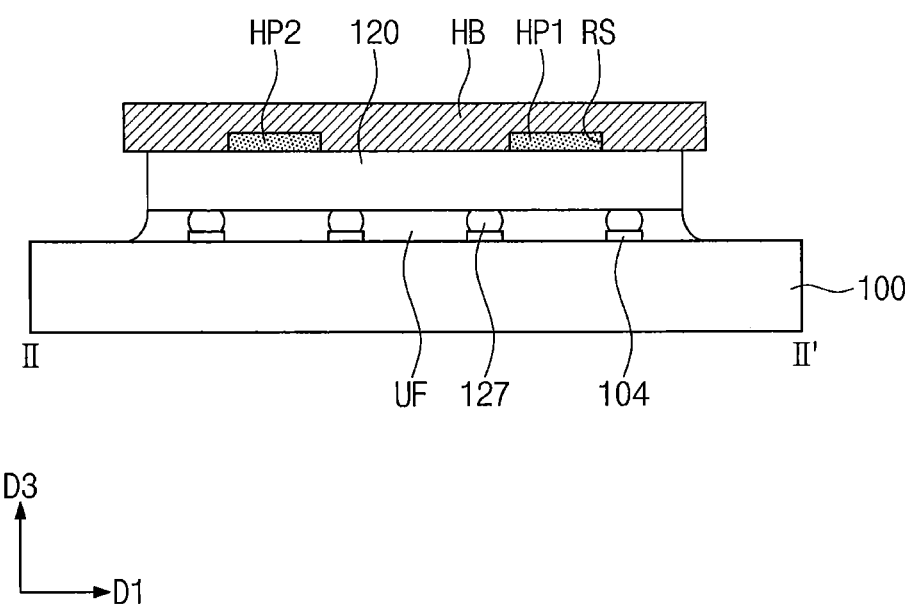
FIG. 3 is a cross-sectional view taken along line II-II' of FIG. 1.
Figure 4:
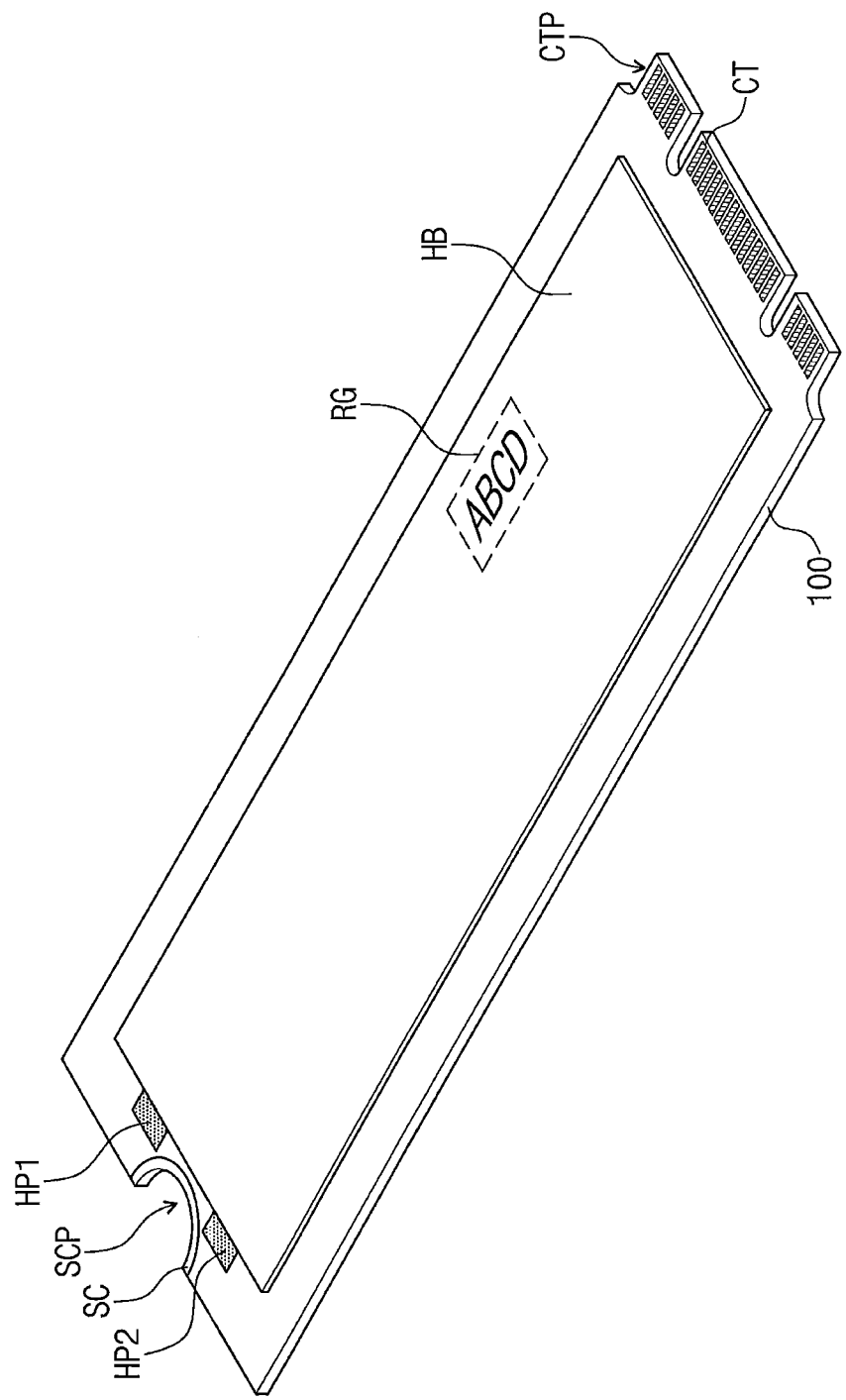
FIG. 4 is a perspective view illustrating a semiconductor package according to exemplary embodiments of the present inventive concept.
Figure 5A:
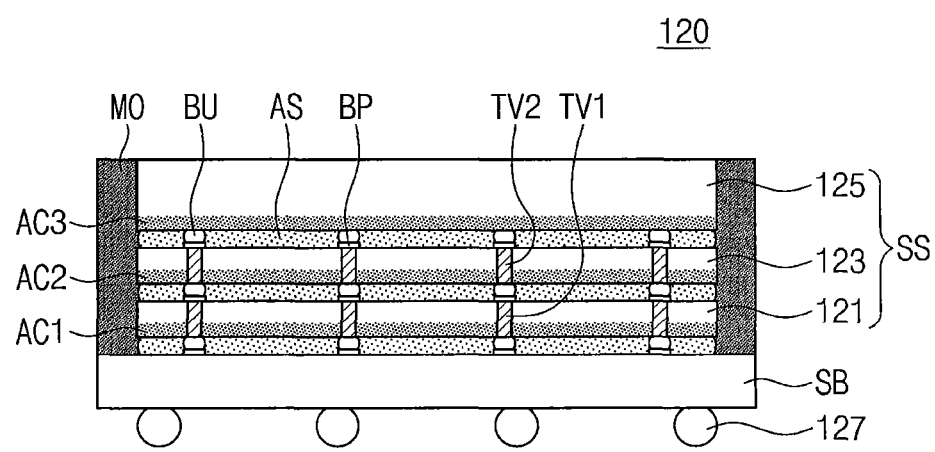
FIGS. 5A and 5B are cross-sectional views illustrating an example of a semiconductor device mounted in a semiconductor package according to exemplary embodiments of the present inventive concept.
Figure 5B:
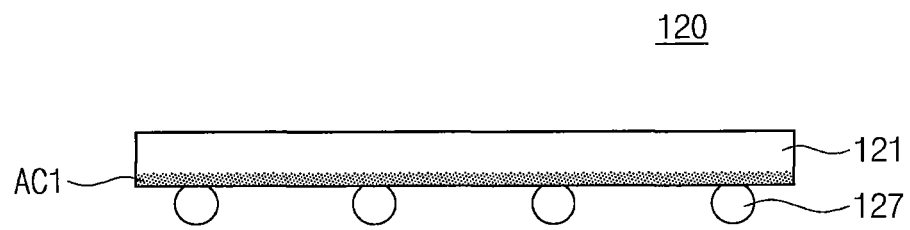

FIG. 1 is a plan view illustrating a semiconductor package according to exemplary embodiments of the present inventive concept. FIG. 2 is a cross-sectional view taken along line I-I' of FIG. 1. FIG. 3 is a cross-sectional view taken along line II-II' of FIG. 1. FIG. 4 is a perspective view illustrating a semiconductor package according to exemplary embodiments of the present inventive concept. FIGS. 5A and 5B are cross-sectional views illustrating an example of a semiconductor device mounted in a semiconductor package according to exemplary embodiments of the present inventive concept.

Referring to FIGS. 1 to 4, one or more semiconductor devices 120, 220 and 320 may be mounted on a package substrate 100. For example, the package substrate 100 may be a printed circuit board (PCB). The package substrate 100 may include a first end EN1 and a second end EN2 facing each other. The package substrate 100 may include a fastening section SCP positioned at the first end EN1 and a connecting terminal section CTP positioned at the second end EN2.

The fastening section SCP may physically connect or combine a semiconductor package according to the present embodiment with an external apparatus. In detail, the fastening section SCP may include a fastening frame SC defining a fastening hole SH. A fastening bolt (not shown) may pass through the fastening hole SH and be inserted into the external apparatus, and, thus, the fastening frame SC may be interposed between the fastening bolt and the external apparatus. The fastening bolt may bind the fastening frame SC together with the external apparatus so that a semiconductor package according to the present embodiment may be fixed onto the external apparatus.

The fastening frame SC may include a material having relatively high thermal conductivity. For example, the fastening frame SC may include a metallic material (e.g., copper or aluminum). Alternatively, the fastening frame SC may include a plastic having superior thermal conductivity. A constituent material of the fastening frame SC is not particularly limited and may be selected from a variety of materials in accordance with embodiments of the inventive concept.

The connecting terminal section CTP may physically and electrically connect a semiconductor package according to the present embodiment with the external apparatus. For example, the connecting terminal section CTP may be inserted into a socket provided in the external apparatus. The connecting terminal section CTP may include a plurality of connecting terminals CT. The connecting terminals CT may be pads electrically connected to the external apparatus. For example, the connecting terminals CT may include a conductive material, such as copper. A constituent material of the connecting terminals CT, however, is not particularly limited and may be selected from a variety of materials in accordance with embodiments of the inventive concept.

Although not shown in figures, the package substrate 100 may include conductive lines that electrically connect the connecting terminal section CTP with the one or more semiconductor devices 120, 220 and 320. The package substrate 100 may further include electronic components (e.g., resistor, transistor, etc.).

The one or more semiconductor devices 120, 220 and 320 may include first, second, and third semiconductor devices 120, 220, 320. Each of the first to third semiconductor devices 120, 220 and 320 may include at least one semiconductor chip. The first to third semiconductor 120, 220 and 320 will be further described below in detail.

External connecting members 127, 227 and 327, such as solder balls, may be provided between the package substrate 100 and the first to third semiconductor devices 120, 220 and 320. Landing pads 104 may be provided on a top surface of the package substrate 100. The external connecting members 127, 227 and 327 may be connected to the landing pads 104. The first to third semiconductor devices 120, 220 and 320 may be electrically connected to the package substrate 100 through the landing pads 104 and the external connecting members 127, 227 and 327.

Under-fill layers UF may be each interposed between the package substrate 100 and each of the first to third semiconductor devices 120, 220 and 320. The under-fill layers UF may bond the first to third semiconductor devices 120, 220 and 320 onto the package substrate 100. The under-fill layers UF may fill between adjacent ones of the external connecting members 127, 227 and 327, such that the external connecting members 127, 227 and 327 may be insulated from each other. For example, the under-fill layers UF may include an epoxy resin. Alternatively, no under-fill layers UF may be provided.

At least one heat pipe HP1 and HP2 may be provided on the first to third semiconductor devices 120, 220 and 320. The at least one of heat pipe HP1 and HP2 may include a first heat pipe HP1 and a second heat pipe HP2. The first and second heat pipes HP1 and HP2 may extend in parallel to each other in a second direction D2. The first heat pipe HP1 will be representatively described in detail hereinafter.

The first heat pipe HP1 may extend to run across all of the first to third semiconductor devices 120, 220 and 320. The first heat pipe HP1 may include a metallic material having superior thermal conductivity. For example, the first heat pipe HP1 may include copper, aluminum, and/or an aluminum alloy. In an embodiment, the first heat pipe HP1 may include a coolant and a coolant duct with which the coolant is filled. The coolant may include a natural refrigerant, such as water, ammonia, nitrogen, carbon dioxide, propane, and butane, and/or a halocarbon-based refrigerant consisting of carbon (C), hydrogen (H), fluorine (F), and chlorine (Cl). The halocarbon-based refrigerant may include at least one of chlorofluorocarbon (CFC), hydrochlorofluorocarbon (HCFC), and/or hydrofluorocarbon (HFC). For example, the first heat pipe HP1 may exhibit thermal conductivity of about 10,000 W/m° C.

The first heat pipe HP1 may include an end EP. The end EP may be adjacent to the fastening section SCP. In this configuration, heat generated from the first to third semiconductor devices 120, 220 and 320 may be transferred through the first heat pipe HP1 to the fastening section SCP. A detailed description of the second heat pipe HP2 may be substantially the same as that of the first heat pipe HP1.

A lid HB may be provided on the first and second heat pipes HP1 and HP2 and the first to third semiconductor devices 120, 220 and 320. As viewed in plan, the lid HB may overlap the first to third semiconductor devices 120, 220 and 320. In contrast, the lid HB may not overlap the fastening section SCP and the connecting terminal section CTP of the package substrate 100. The lid HB may have opposite ends each adjacent to one of the fastening section SCP and the connecting terminal section CTP.

In an embodiment, the lid HB may include a surface (referred to hereinafter as a bottom surface) facing the first to third semiconductor devices 120, 220 and 320. At least one recession RS may be provided at the bottom surface of the lid HB. The recessions RS may be shaped and positioned to receive the first and second heat pipes HP1 and HP2. Accordingly, the first and second heat pipes HP1 and HP2 may be inserted into corresponding recessions RS. In other words, as shown in FIG. 3, the lid HB may be in direct contact with sidewalls and top surfaces of the first and second heat pipes HP1 and HP2. In addition, as shown in FIG. 3, the bottom surface of the lid HB may be in direct contact with top surfaces of the first to third semiconductor devices 120, 220 and 320.

The lid HB may include a metallic material having superior thermal conductivity. For example, the lid HB may include aluminum, copper, and/or a copper-tungsten alloy. Therefore, heat generated from the first to third semiconductor devices 120, 220 and 320 may be discharged through the lid HB to the outside air. In addition, as the lid HB has opposite ends each adjacent to one of the fastening section SCP and the connecting terminal section CTP, heat generated from the first to third semiconductor devices 120, 220 and 320 may be transferred through the lid HB to the fastening section SCP and the connecting terminal section CTP.

As shown in FIG. 4, a top surface of the lid HB may include a printing region RG on which letters are printed. The printing region RG may be provided thereon with information about manufacturer, model name, product code, etc. The metallic lid HB and the letter-printed printing region RG may provide an aesthetic appearance to a semiconductor package according to the present embodiment.

In a semiconductor package according to exemplary embodiments of the present inventive concept, the fastening section SCP and the connecting terminal section CTP may be physically in direct contact with the external apparatus. Accordingly, heat generated from the semiconductor package may be effectively transferred to the external apparatus through the fastening section SCP and the connecting terminal section CTP. For example, thermal energy exhausted to the external apparatus through the fastening section SCP and the connecting terminal section CTP may be greater than thermal energy exhausted to the outside air through the top surface of the lid HB. This may be because the fastening section SCP, the connecting terminal section CTP, and the external apparatus have thermal conductivities greater than thermal conductivity of the outside air. Moreover, heat generated from the first to third semiconductor devices 120, 220 and 320 may be effectively transferred to the fastening section SCP and the connecting terminal section CTP through the lid HB and the first and second heat pipes HP1 and HP2 in contact with the first to third semiconductor devices 120, 220 and 320. It therefore may be possible to efficiently and quickly dissipate heat from a semiconductor package.

In a comparative example where the first and second heat pipes HP1 and HP2 are omitted, it may be relatively difficult to transfer heat generated from the first to third semiconductor devices 120, 220 and 320 to the fastening section SCP and the connecting terminal section CTP. This may be because the first to third semiconductor devices 120, 220 and 320 may be relatively far away from the fastening section SCP and the connecting terminal section CTP.

Detailed examples of the first semiconductor device 120 will be representatively described with reference to FIGS. 5A and 5B. As one example, as shown in FIG. 5A, the first semiconductor device 120 may be configured as a package shape. In detail, the first semiconductor device 120 may include a substrate SB and a stack structure SS mounted on the substrate SB. For example, the substrate SB may be a printed circuit board (PCB). The substrate SB may have a bottom surface including thereon first external connecting members 127, such as solder balls. The substrate SB may also have a top surface including thereon bonding pads BP. In addition, although not shown in figures, the substrate SB may be provided therein with at least one through via.

The stack structure SS may include first, second, and third semiconductor chips 121, 123 and 125 that are sequentially stacked. The first semiconductor chip 121 may include first through vias TV1 penetrating therethrough to electrically connect with a first circuit layer AC1, and the second semiconductor chip 123 may include second through vias TV2 penetrating therethrough to electrically connect with a second circuit layer AC2. In contrast, unlike the first and second semiconductor chips 121 and 123, the third semiconductor chip 125 may have no through vias, but is not particularly limited thereto. In an embodiment, the first to third semiconductor chips 121, 123 and 125 may be memory chips. For example, the first to third semiconductor chips 121, 123 and 125 may be nonvolatile memory chips, such as a NAND Flash Chip and/or a VNAND Flash Chip.

The first to third semiconductor chips 121, 123 and 125 may be substantially the same chip. In other words, the first to third semiconductor chips 121, 123 and 125 may be chips performing substantially the same function. The first to third semiconductor chips 121, 123 and 125 may have substantially the same planar shape and size. The third semiconductor chip 125 may possibly have a greater thickness than those of the first and second semiconductor chips 121 and 123, but is not particularly limited thereto.

The first circuit layer AC1 of the first semiconductor chip 121 may be provided thereon with connecting members BU, such as solder balls or solder bumps. The first semiconductor chip 121 may be electrically connected through its connecting members BU to the substrate SB. The first through vias TV1 of the first semiconductor chip 121 may be provided thereon with corresponding bonding pads BP.

The second circuit layer AC2 of the second semiconductor chip 123 may be provided thereon with connecting members BU, such as solder balls or solder bumps. The second semiconductor chip 123 may be electrically connected through its connecting members BU to the first semiconductor chip 121. The second through vias TV2 of the second semiconductor chip 123 may be provided thereon with corresponding bonding pads BP.

The third circuit layer AC3 of the third semiconductor chip 125 may be provided thereon with connecting members BU, such as solder balls or solder bumps. The third semiconductor chip 125 may be electrically connected through its connecting members BU to the second semiconductor chip 123. Thus, the substrate SB and the first to third semiconductor chips 121, 123 and 125 may be vertically and electrically connected to each other.

Adhesive layers AS may be provided to fill a first space between the substrate SB and the first semiconductor chip 121, a second space between the first and second semiconductor chips 121 and 123, and a third space between the second and third semiconductor chips 123 and 125. The first to third semiconductor chips 121, 123 and 125 on the substrate SB may be bonded together by the adhesive layers AS. In addition, the adhesive layers AS may fill between adjacent connecting members BU such that the connecting members BU may be insulated from each other.

The substrate SB may be provided thereon with a molding layer MO covering the stack structure SS. For example, the molding layer MO may cover sidewalls of the first to third semiconductor chips 121, 123 and 125. The molding layer MO may have a top surface coplanar to a top surface of the third semiconductor chip 125. The top surface of the third semiconductor chip 125 may then be exposed to outside. As such, it may be possible to efficiently dissipate heat generated from the first to third semiconductor chips 121, 123 and 125.

As another example, as shown in FIG. 5B, the first semiconductor device 120 may be configured as a semiconductor chip shape. In detail, the first semiconductor device 120 may include a first semiconductor chip 121 and first external connecting members 127 electrically connected to a first circuit layer AC1 of the first semiconductor chip 121. In an embodiment, the first semiconductor chip 121 may be a memory chip. For example, the first semiconductor chip 121 may be a nonvolatile memory chip, such as a NAND Flash Chip or a V-NAND Flash Chip. Similar to the stack structure SS discussed with reference to FIG. 5A, the first semiconductor device 120 may further include additional semiconductor chips (not shown) stacked on the first semiconductor chip 121.

FIGS. 6, 8, 10 and 12 are cross-sectional views corresponding to line I-I' of FIG. 1 illustrating a semiconductor package according to exemplary embodiments of the present inventive concept. FIGS. 7, 9, 11 and 13 are cross-sectional views corresponding to line II-II' of FIG. 1 illustrating a semiconductor package according to exemplary embodiments of the present inventive concept. The description of the cross-sectional views according to FIGS. 6 to 13 may not be substantially the same as the description of the semiconductor package shown in FIG. 1. In the embodiments that follow, a detailed description of technical features repetitive to those formerly discussed with reference to FIGS. 1 to 5B will be omitted and differences will be described in detail.

Figure 6:
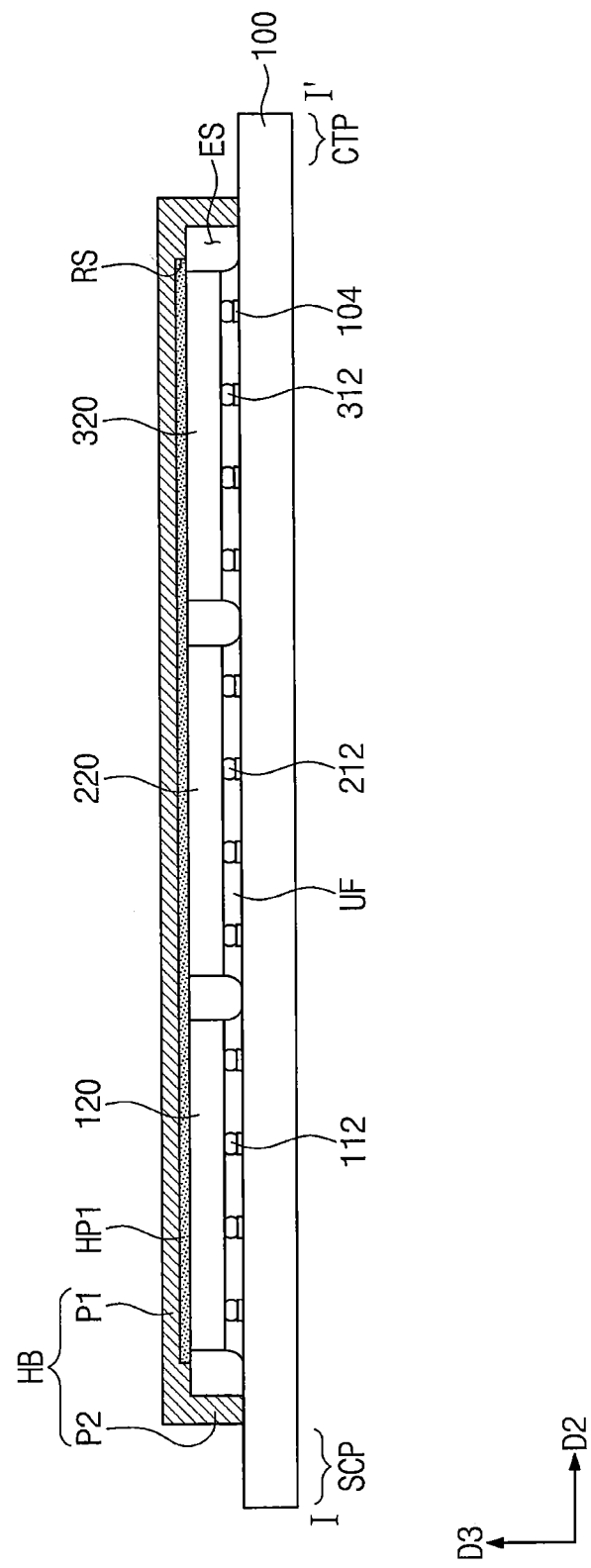
FIGS. 6, 8, 10 and 12 are cross-sectional views corresponding to line I-I' of FIG. 1 illustrating a semiconductor package according to exemplary embodiments of the present inventive concept.
Figure 7:
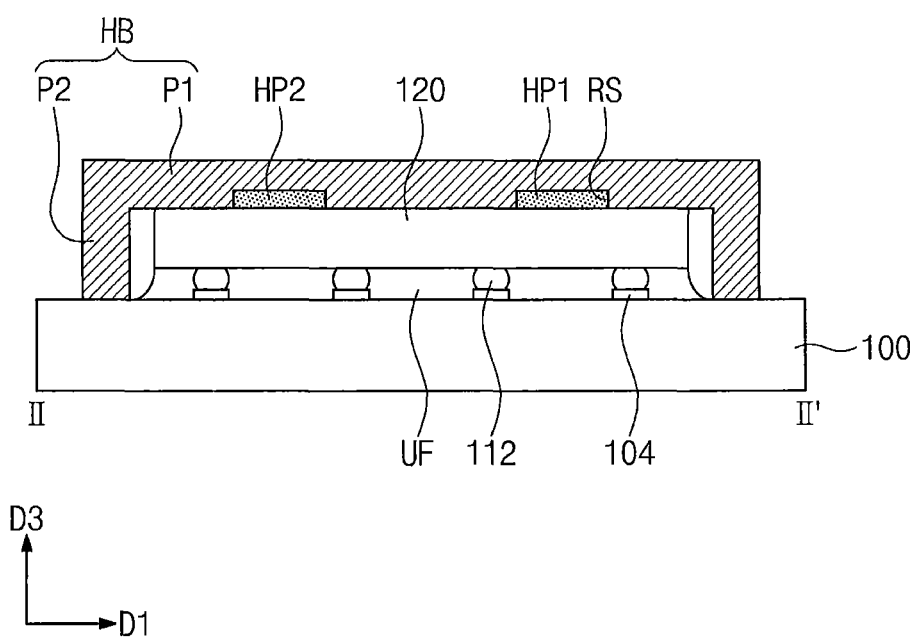
FIGS. 7, 9, 11 and 13 are cross-sectional views corresponding to line II-II' of FIG. 1 illustrating a semiconductor package according to exemplary embodiments of the present inventive concept.

Referring to FIGS. 6 and 7, the lid HB may include a first part P1 and a second part P2. The first part P1 may horizontally extend on the first and second heat pipes HP1 and HP2 and on the first to third semiconductor devices 120, 220 and 320. For example, the first part P1 may extend in first and second directions D1 and D2 on the first and second heat pipes HP1 and HP2 and on the first to third semiconductor devices 120, 220 and 320. The second part P2 may extend in a vertical direction from the first part P1 toward the package substrate 100. The vertical direction may be anti-parallel to a third direction D3. In this configuration, the second part P2 may be in direct contact with the top surface of the package substrate 100. The first and second parts P1 and P2 may define an empty space ES in the lid HB. The first to third semiconductor devices 120, 220 and 320 may be positioned within the empty space ES.

In a semiconductor package according to the present embodiment, the lid HB may seal or encapsulate the first to third semiconductor devices 120, 220 and 320. Accordingly, the lid HB may protect the first to third semiconductor devices 120, 220 and 320 from external contamination.

Figure 8:
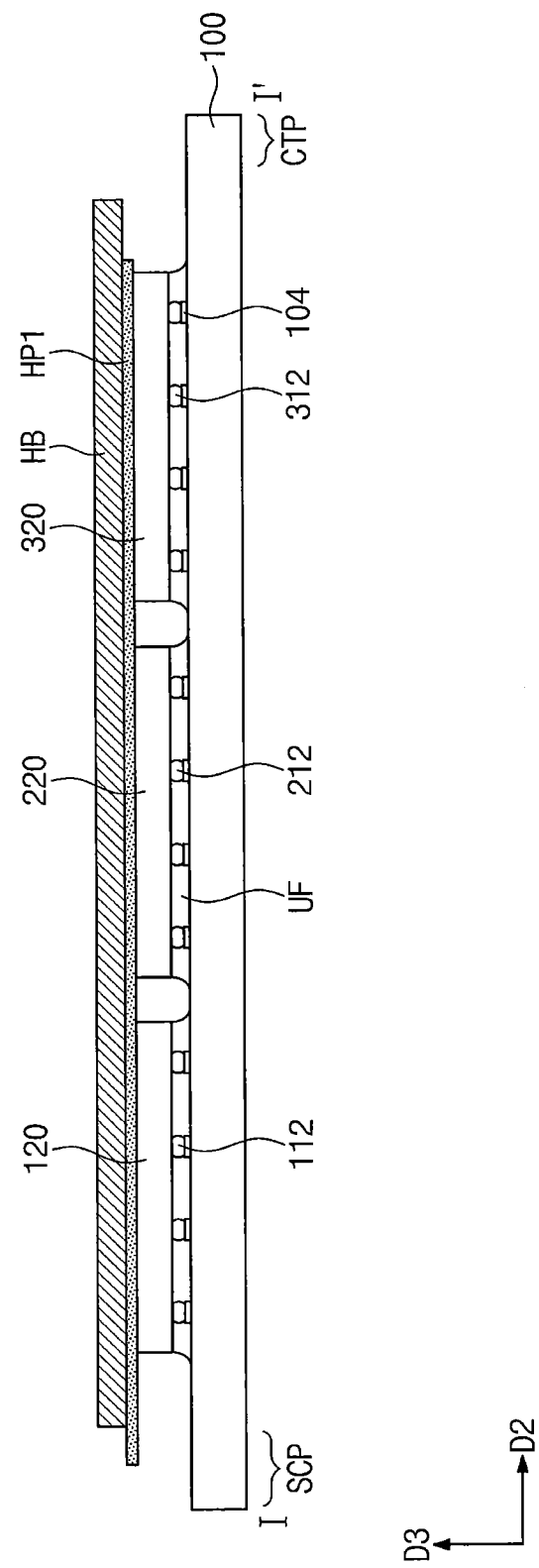
Figure 9:
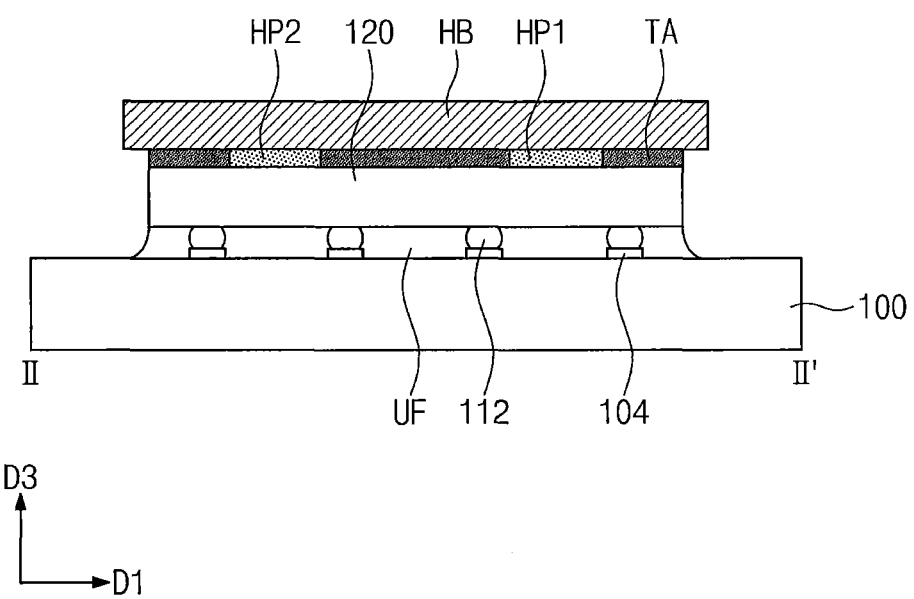

Referring to FIGS. 8 and 9, a thermal adhesive TA may be provided to cover top surfaces of the first to third semiconductor devices 120, 220 and 320 and fill a space between the first and second heat pipes HP1 and HP2. The thermal adhesive TA may adhere the lid HB to the first to third semiconductor devices 120, 220 and 320.

The thermal adhesive TA may include a phase change material (PCM) that can be changed from a solid state into a semisolid state when heat is applied. The phase change material may be one of an organic-based material (e.g., paraffin), inorganic-based material (e.g., hydrated salt, metallic material), and an eutectic material (e.g., an organic-organic material, an organic-inorganic material, an inorganic-inorganic material). In some embodiments, the thermal adhesive TA may have a relatively high thermal conductivity. To increase thermal conductivity of the thermal adhesive TA, the thermal adhesive TA may include particles having high thermal conductivity.

The lid HB may cover top surfaces of the thermal adhesive TA, the first heat pipe HP1, and the second heat pipe HP2. The lid HB may have no recession RS described with reference to FIGS. 1 to 4. Therefore, the lid HB may have a bottom surface spaced apart from the first to third semiconductor devices 120, 220 and 320 across the first and second heat pipes HP1 and HP2.

Figure 10:
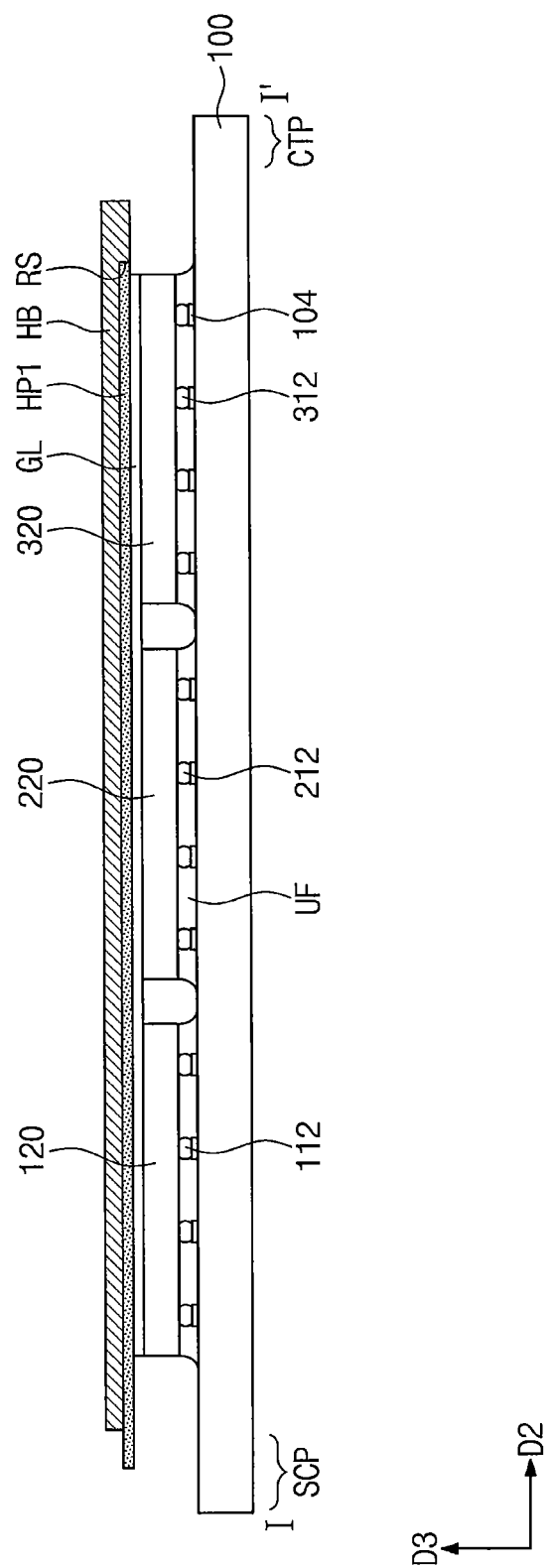
Figure 11:
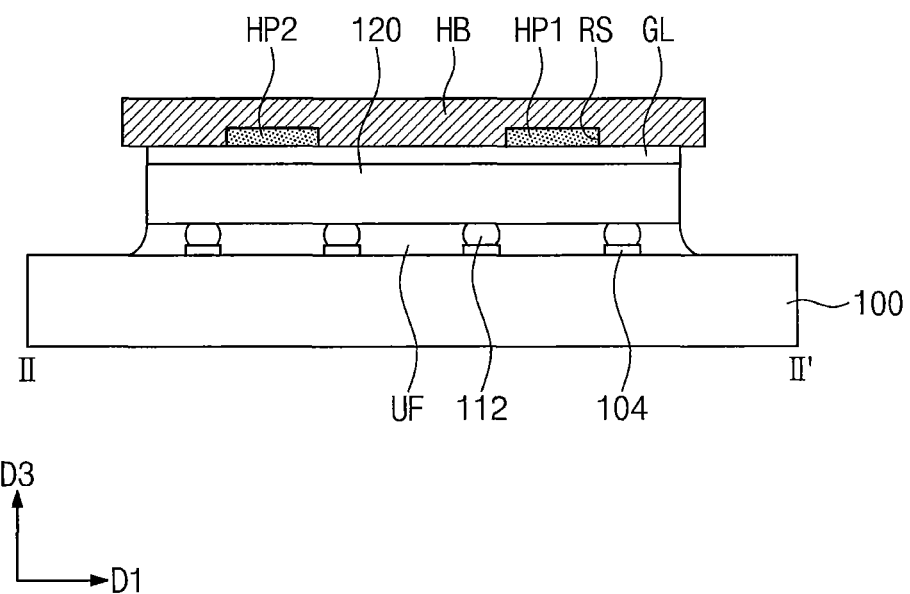

Referring to FIGS. 10 and 11, a heat spreader layer GL may be interposed between the lid HB and the first to third semiconductor devices 120, 220 and 320. The heat spreader layer GL may be shaped like a film or sheet. The heat spreader layer GL may directly cover top surfaces of the first to third semiconductor devices 120, 220 and 320. The heat spreader layer GL may directly cover a bottom surface of the lid HB. For example, the heat spreader layer GL may include graphene, graphite, or a combination thereof. As materials such as graphene and graphite have relatively superior thermal conductivity, heat generated from the first to third semiconductor devices 120, 220 and 320 may be transferred through the heat spreader layer GL, together with the lid HB and the first and second heat pipes HP1 and HP2, to the fastening section SCP and the connecting terminal section CTP.

In one example, the first and second heat pipes HP1 and HP2 may lie above the heat spreader layer GL, such that the first to third semiconductor devices 120, 220 and 320 may be vertically spaced apart from the first and second heat pipes HP1 and HP2. In another example not shown in the figures, the heat spreader layer GL may lie above the first and second heat pipes HP1 and HP2. In yet another example not shown in the figures, an additional heat spreader layer may further be provided to cover a top surface of the lid HB.

Figure 12:
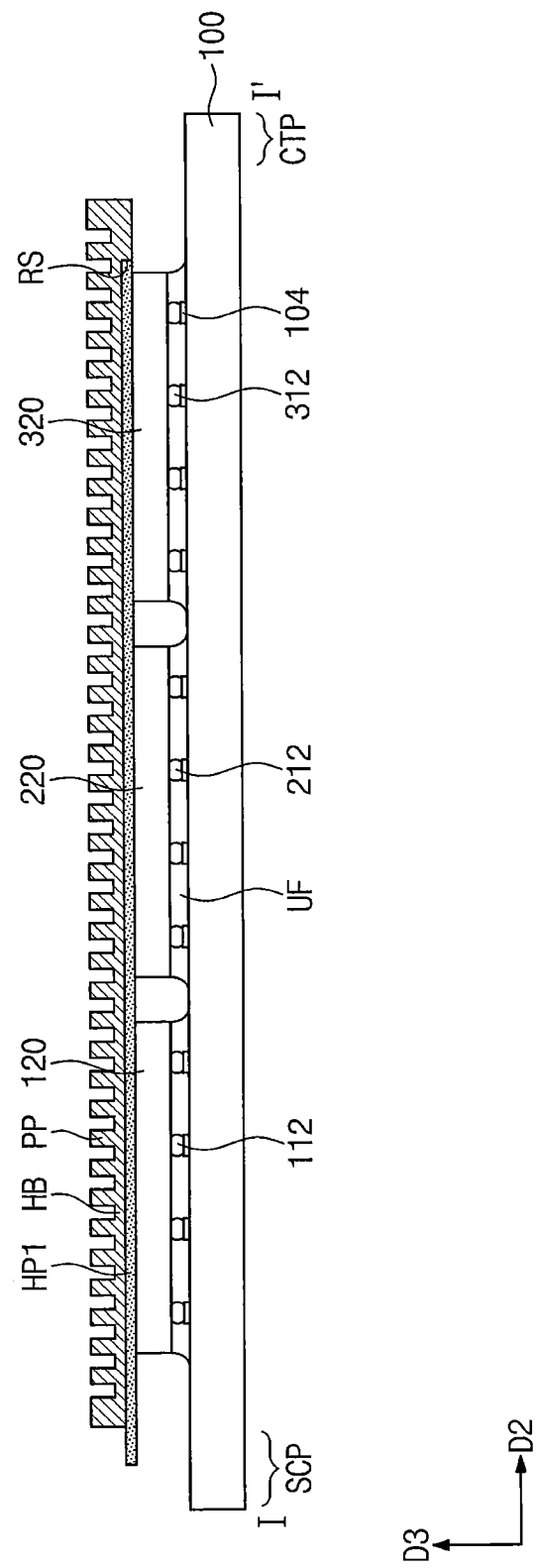
Figure 13:
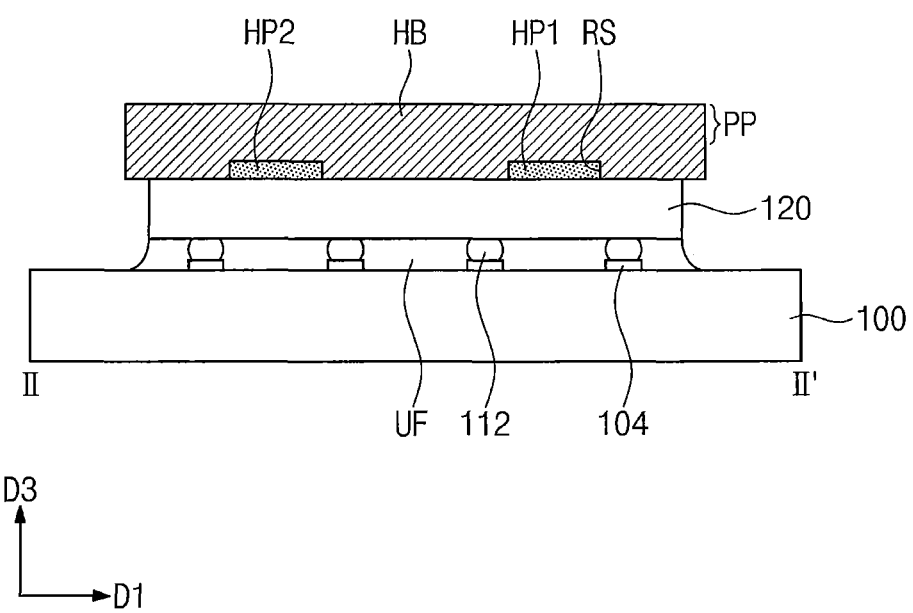

Referring to FIGS. 12 and 13, the lid HB may have a heat sink shape. For example, the lid HB may include a plurality of protrusions PP formed on its upper portion. The protrusions PP may allow the lid HB to have an increased surface area in contact with the outside air. A semiconductor package may hence have improved efficiency of heat dissipation.

Figure 14:
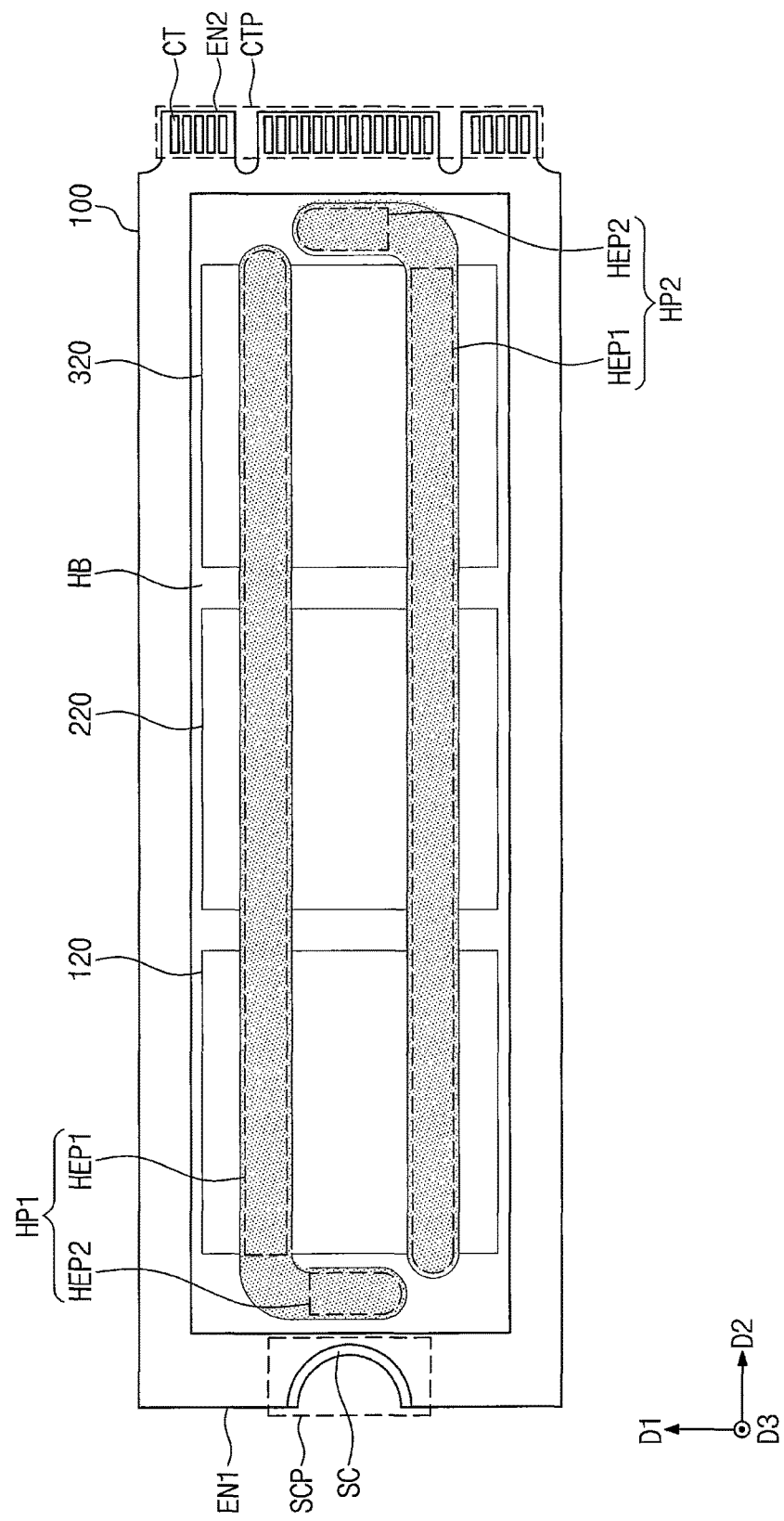
FIGS. 14 and 15 are plan views illustrating a semiconductor package according to exemplary embodiments of the present inventive concept.
Figure 15:
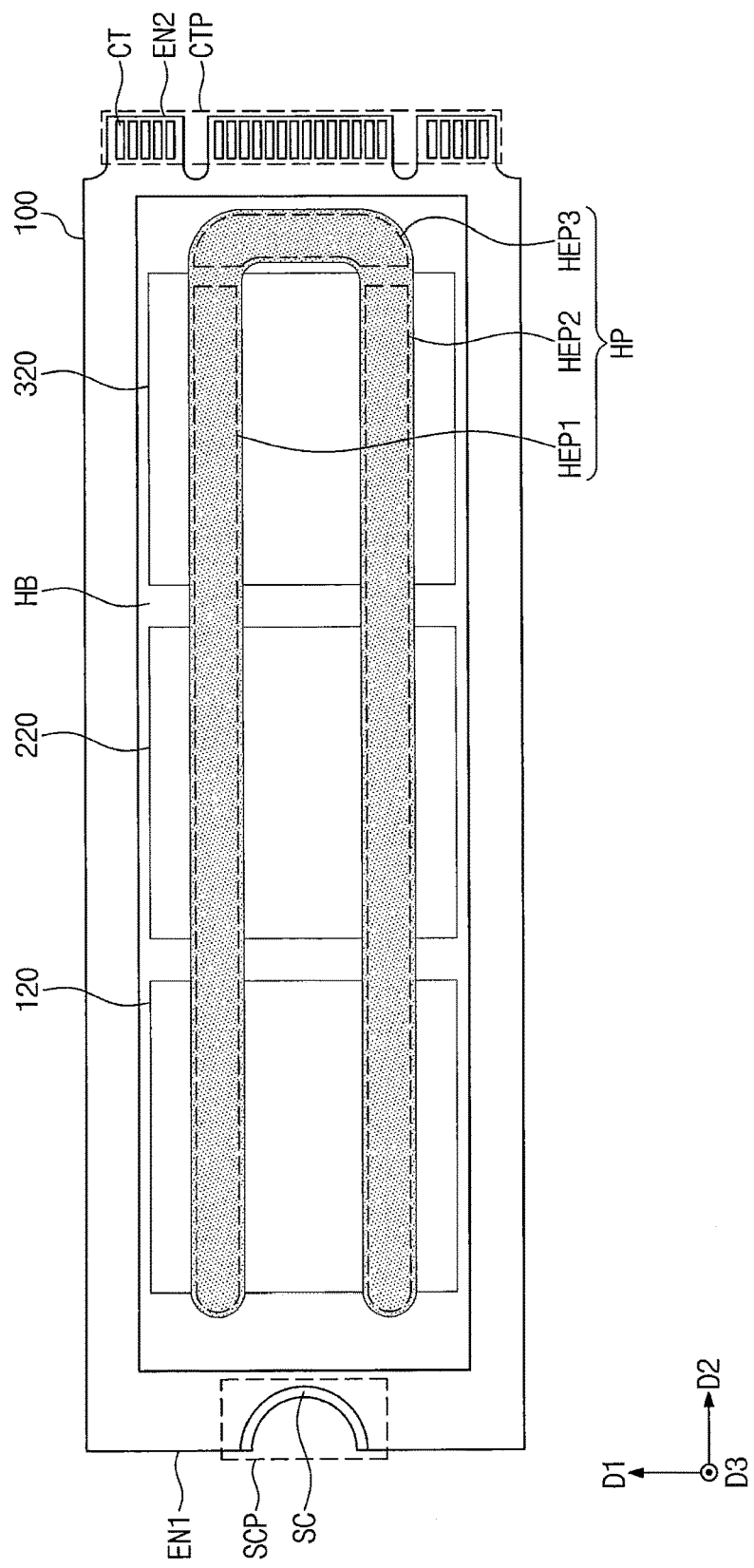

FIGS. 14 and 15 are plan views illustrating a semiconductor package according to exemplary embodiments of the present inventive concept. FIGS. 14 and 15 illustrate various examples of a heat pipe according to exemplary embodiments of the present inventive concept. In the embodiments that follow, a detailed description of technical features repetitive to those formerly described with reference to FIGS. 1 to 5B will be omitted and differences will be discussed in detail.

Referring to FIG. 14, each of the first and second heat pipes HP1 and HP2 may include a first extension HEP1 and a second extension HEP2. The first extensions HEP1 may extend in the second direction D2 and anti-parallel to the second direction while running across the first to third semiconductor devices 120, 220 and 320. The second extensions HEP2 may extend in the first direction D1 and anti-parallel to the first direction D1. The second extensions HEP2 may not vertically overlap the first to third semiconductor devices 120, 220 and 320. For example, the second extension HEP2 of the first heat pipe HP1 may be positioned between the first semiconductor device 120 and the first end EN1 of the package substrate 100, and the second extension HEP2 of the second heat pipe HP2 may be positioned between the third semiconductor device 320 and the second end EN2 of the package substrate 100. An end of the first extension HEP1 may be connected to an end of the second extension HEP2. For example, the lid HB may completely cover the first and second heat pipes HP1 and HP2.

The second extension HEP2 of the first heat pipe HP1 may be adjacent to the fastening section SCP, and the second extension HEP2 of the second heat pipe HP2 may be adjacent to the connecting terminal section CTP. In this configuration, heat generated from the first to third semiconductor devices 120, 220 and 320 may be effectively transferred through the second extensions HEP2 to the fastening section SCP and the connecting terminal section CTP.

Referring to FIG. 15, a single heat pipe HP may be provided. The heat pipe HP may include first, second, and third extensions HEP1, HEP2 and HEP3. The first and second extensions HEP1 and HEP2 may extend in parallel to each other in the second direction D2 while running across the first to third semiconductor devices 120, 220 and 320. The third extension HEP3 may extend in the first direction D1 to connect the first and second extensions HEP1 and HEP2 to each other. In other words, the third extension HEP3 may have opposite ends, one of which may be connected to one end of the first extension HEP1 and the other of which may be connected to one end of the second extension HEP2. The third extension HEP3 may not vertically overlap the first to third semiconductor devices 120, 220 and 320. In other words, the third extension HEP3 may be positioned between the third semiconductor device 320 and the second end EN2 of the package substrate 100. For example, the lid HB may completely cover the heat pipe HP.

The third extension HEP3 of the heat pipe HP may be adjacent to the connecting terminal section CTP. In this configuration, heat generated from the first to third semiconductor devices 120, 220 and 320 may be effectively transferred through the third extension HEP3 to the connecting terminal section CTP. Alternatively, although not shown in the figures, the third extension HEP3 may be positioned between the first semiconductor device 120 and the first end EN1 of the package substrate 100. In this case, heat generated from the first to third semiconductor devices 120, 220 and 320 may be effectively transferred through the third extension HEP3 to the fastening section SCP.

In the semiconductor package according to the present inventive concept, heat generated from the semiconductor device may be transferred through the heat pipe and the lid to the fastening section and the connecting terminal section of the package substrate with improved efficiency. The fastening section and the connecting terminal section may dissipate heat from the semiconductor package to the external apparatus.

Although exemplary embodiments of the present inventive concept have been described with reference to the accompanying figures, it will be understood that various changes in form and details may be made therein without departing from the spirit and scope of the present inventive concept. It therefore will be understood that the embodiments described above are illustrative, but not limitative, in all aspects.

What is claimed is:

1. A semiconductor package, comprising:
   a package substrate;
   at least one semiconductor device mounted on the package substrate;
   at least one heat pipe on the at least one semiconductor device; and
   a lid on the at least one semiconductor device and the at least one heat pipe,
   wherein the at least one heat pipe comprises:
      a first extension that runs across the at least one semiconductor device and extends in a first direction; and
      a second extension that extends from the first extension in a second direction crossing the first direction, the second extension being between one end of the package substrate and one end of the semiconductor device in plan view.

2. The semiconductor package of claim 1, wherein
   the at least one heat pipe further comprises a third extension that runs across the semiconductor device and extends in the first direction, and
   the second extension connects the first and third extensions to each other.

3. The semiconductor package of claim 1, wherein
   the lid comprises at least one recession formed at its surface facing the semiconductor device, and
   the at least one heat pipe is provided in the recession.

4. The semiconductor package of claim 1, wherein
   the package substrate comprises a connecting section physically and/or electrically connected to an external apparatus, and
   the second extension is adjacent to the connecting section.

5. The semiconductor package of claim 1, wherein the lid comprises a plurality of protrusions formed on an upper portion opposite the package substrate.

6. A semiconductor package, comprising:
   a package substrate comprising a fastening section and a connecting terminal section at opposite ends thereof, respectively;
   at least one semiconductor device mounted on the package substrate;
   at least one heat pipe on the at least one semiconductor device; and
   a lid on the at least one semiconductor device and the at least one heat pipe,
   wherein the at least one heat pipe comprises:
      a first extension that runs across the at least one semiconductor device and extends in a first direction; and
      a second extension that extends from the first extension in a second direction crossing the first direction,
   wherein the second extension is adjacent to either the fastening section or the connecting terminal section.

7. The semiconductor package of claim 6, wherein the fastening section and the connecting terminal section are spaced apart from each other in the first direction.

8. The semiconductor package of claim 6, wherein the fastening section comprises a fastening frame defining a fastening hole.

9. The semiconductor package of claim 6, wherein the connecting terminal section comprises a plurality of connecting terminals electrically connected to an external apparatus.

10. The semiconductor package of claim 6, wherein
    the lid comprises at least one recession formed on its surface facing the at least one semiconductor device, and
    the at least one heat pipe is provided in the at least one recession.

11. The semiconductor package of claim 6, wherein the lid comprises:
    a first part horizontally extending on the at least one semiconductor device; and
    a second part vertically extending from the first part toward the package substrate.

12. The semiconductor package of claim 6, further comprising a thermal adhesive interposed between the lid and the at least one semiconductor device,
    wherein the thermal adhesive comprises a phase change material (PCM).

13. The semiconductor package of claim 6, further comprising a heat spreader layer interposed between the lid and the at least one semiconductor device,
    wherein the heat spreader layer comprises graphene, graphite, or a combination of graphene and graphite.

14. A semiconductor package, comprising:
    a package substrate having first and second external interface sections at opposing ends, respectively;
    a semiconductor device mounted on the package substrate;
    a heat pipe on the semiconductor device; and
    a lid on the heat pipe and the semiconductor device;
    wherein the heat pipe comprises:
    first and second parallel pipe sections extending between the first and second external interface sections of the package substrate; and
    a third pipe section connected to at least one of the first and second parallel pipe sections, the third pipe section being between the semiconductor device and the first external interface section and being nonparallel with the at least one of the first and second parallel pipe sections.

15. The semiconductor package of claim 14, wherein the lid has an upper surface, opposite the package substrate, having a plurality of protrusions extending therefrom.

16. The semiconductor package of claim 14, wherein the third pipe section is connected to the first pipe section at an end of the first pipe section,
   wherein the heat pipe further comprises a fourth pipe section connected to the second pipe section at an end of the second pipe section, the fourth pipe section being between the semiconductor device and the second external interface section and being nonparallel with the second pipe section.

17. The semiconductor package of claim 14, wherein the third pipe section connects the respective ends of the first and second parallel pipe sections.

\* \* \* \* \*